(12) United States Patent
Alvarado Castañeda

(10) Patent No.: US 10,678,149 B2
(45) Date of Patent: Jun. 9, 2020

(54) METHOD AND APPARATUS FOR MAINTAINING THE SURFACE OF A RETICLE FREE OF PARTICLES

(71) Applicant: Diego Arturo Alvarado Castañeda, Mexico City (MX)

(72) Inventor: Diego Arturo Alvarado Castañeda, Mexico City (MX)

( * ) Notice: Subject to any disclaimer, the term of this patent is extended or adjusted under 35 U.S.C. 154(b) by 0 days.

(21) Appl. No.: 15/739,726

(22) PCT Filed: Jun. 24, 2015

(86) PCT No.: PCT/IB2015/054752
§ 371 (c)(1),
(2) Date: Dec. 23, 2017

(87) PCT Pub. No.: WO2016/079607
PCT Pub. Date: May 26, 2016

(65) Prior Publication Data
US 2018/0188662 A1   Jul. 5, 2018

(51) Int. Cl.
*G03F 7/20* (2006.01)

(52) U.S. Cl.
CPC ............ *G03F 7/70908* (2013.01); *G03F 7/20* (2013.01); *G03F 7/70033* (2013.01)

(58) Field of Classification Search
CPC ............ G03F 7/70916; G03F 7/70908; G03F 7/70725; G03F 7/70866
See application file for complete search history.

(56) References Cited

U.S. PATENT DOCUMENTS

| | | | |
|---|---|---|---|
| 6,781,673 B2 | 8/2004 | Moors et al. | |
| 8,115,901 B2 | 2/2012 | Hayashi | |
| 2002/0096647 A1* | 7/2002 | Moors ................ | G03F 7/70558 250/492.1 |
| 2003/0190012 A1 | 10/2003 | Ahmad | |
| 2004/0119394 A1 | 6/2004 | Klebanoff et al. | |
| 2007/0075276 A1* | 4/2007 | Nolscher ............ | G03F 7/70916 250/504 R |
| 2007/0235666 A1 | 10/2007 | Ruzic et al. | |
| 2009/0128795 A1* | 5/2009 | Hayashi ................ | G03B 27/62 355/75 |
| 2010/0068659 A1* | 3/2010 | Hamaya .............. | G03F 7/70841 430/325 |
| 2011/0174996 A1 | 7/2011 | Someya et al. | |
| 2011/0222040 A1 | 9/2011 | Steinhoff et al. | |
| 2012/0281196 A1* | 11/2012 | Loering ................ | G02B 1/113 355/71 |
| 2013/0070218 A1* | 3/2013 | Ivanov ................ | G03F 7/70916 355/30 |
| 2013/0235357 A1 | 9/2013 | Delgado et al. | |

(Continued)

FOREIGN PATENT DOCUMENTS

WO   WO2011/110467   9/2011

OTHER PUBLICATIONS

International Search Report and Written Opinion issued in corresponding International Patent Application No. PCT/IB2015/054752 dated Nov. 12, 2015 (9 pages).

*Primary Examiner* — Steven Whitesell Gordon

(57) ABSTRACT

The present invention is directed to a method and apparatus for maintaining a surface of an optical component free of foreign particles using passive and active approaches to particle control.

17 Claims, 6 Drawing Sheets

(56) References Cited

U.S. PATENT DOCUMENTS

| | | | |
|---|---|---|---|
| 2014/0111782 A1* | 4/2014 | Park | G03F 7/70916 355/30 |
| 2014/0253887 A1* | 9/2014 | Wu | G03F 1/82 355/30 |

* cited by examiner

METHOD AND APPARATUS FOR MAINTAINING THE SURFACE OF A RETICLE FREE OF PARTICLES

The present invention is directed to a method and apparatus for maintaining a surface of an optical component free of foreign particles. More specifically, the invention is directed to ensuring that an optical component used in an EUV scanner or inspection tool is maintained free of particles that could cause printable defects.

BACKGROUND OF THE INVENTION

In a lithographic process, a single particle landing on the front side of a reticle can result in the need of reworking or scrapping several lots of wafers. During the development of DUV lithography, the problems caused by particles landing on a mask or reticle were solved by employing transparent pellicles that maintain such particles in a plane that is out-of focus with respect to the printed image. However, alternatives were sought to the use of pellicles for EUV lithography given that no known material is entirely transparent to EUV light.

The initial EUV tools were built based on ultra-clean vacuum chambers with the expectation that very few particles would be emitted by the internal components of the tool. Nevertheless, as particles are eventually emitted by mechanical components, light sources and wafers, this initial approach to particle control depends on an extensive metrology and reticle cleaning regime in order to minimize the number wafers that need to be reworked/scrapped after a particle eventually lands on the surface of an reticle and starts causing printable defects.

In view of such shortcomings, EUV pellicles comprising membranes as thin as 50 nm have been developed. However, said pellicles are extremely fragile structures that have a limited lifetime, can be a source of particles when broken, can have a non-negligible effect on critical dimension uniformity, complicate defect inspection, imply the loss of at least 20% of the light reaching the wafer and have to be removed for cleaning, patterning and non-actinic inspection.

Given the low throughput of early EUV scanners and the likely Esize values and number of masks needed for advanced manufacturing nodes, there is a need of increasing the power of EUV light sources for lithographic scanners and as well as for actinic inspection tools. However, using an EUV pellicle for particle control in such applications causes a loss of throughput due to light absorption comparable to adding an additional mirror to the projection optics without any increase in resolution. Furthermore, as more powerful EUV sources become available, the lifetime of EUV pellicles could also be reduced due to increased thermal loads and higher acceleration of the reticle stage leading to more frequent disruptions due to broken pellicles.

The instant invention provides a pellicle-less approach to particle control that is based on active and passive particle deflection methods.

PRIOR ART

The U.S. Pat. No. 6,781,673 B1 discloses an EUV scanner having a particle shield comprising conductive plates that are arranged perpendicular to a reticle, a negatively charged collector plate or shield that lies parallel to the reticle and attracts particles ionized by a light beam, as well as arranging electrodes in the walls of an mirror box to catch particles.

The U.S. Pat. No. 8,115,901 B2 discloses surrounding a reticle with electrodes and generating an electric field between the electrodes and an optical barrel that encloses the projection optics. U.S. Pat. No. 8,115,901 B2 also discloses the use of an optical path limiting member arranged very close to the optical barrel in order to limit the optical path of EUV light.

The application US 2013/0235357 A1 discloses an apparatus for particle control having a barrier and charging plates having apertures for allowing the illumination of a reticle. The charging plates are arranged between a reticle and the barrier.

The application WO 2011/110467 A2 discloses a system for removing contaminant particles having electrodes that surround an optical path in close proximity to a reticle.

SUMMARY OF THE INVENTION

The instant invention is based on the use of a passive particle control approach combined with at least one active particle control approach. The passive approach comprises physically reducing the number of particles able to land on the surface of the reticle by limiting the trajectories of such particles to trajectories located almost entirely within the optical path of the actinic light that reaches the reticle.

In contrast with prior art solutions for particle control that depend on arranging the reticle behind one or more mechanical barriers that are located in the immediate periphery of the reticle, the instant invention uses protection electrodes that are arranged across the optical path between the reticle and the projection and illumination optics, ensuring in this manner that the only particles able to land on the reticle are particles emitted chiefly from the surface of the mirrors located immediately before and after the reticle following the optical path of the actinic light.

The active approach to particle control comprises the use of at least one particle trap to remove the particles traveling within the optical path. Such particle trap can be implemented as an electrostatic trap, a gas curtain, a plasma curtain, a cold trap or a thermophoretic trap.

DETAILED DESCRIPTION

This section describes the invention based on the figures and representative embodiments which are not intended to be limiting. A person skilled in the art would appreciate that, although the embodiments of the invention are applied to protecting the surface of an EUV reticle in a lithographic or inspection tool, the invention can also be applied to protect different surfaces.

Figure 1:
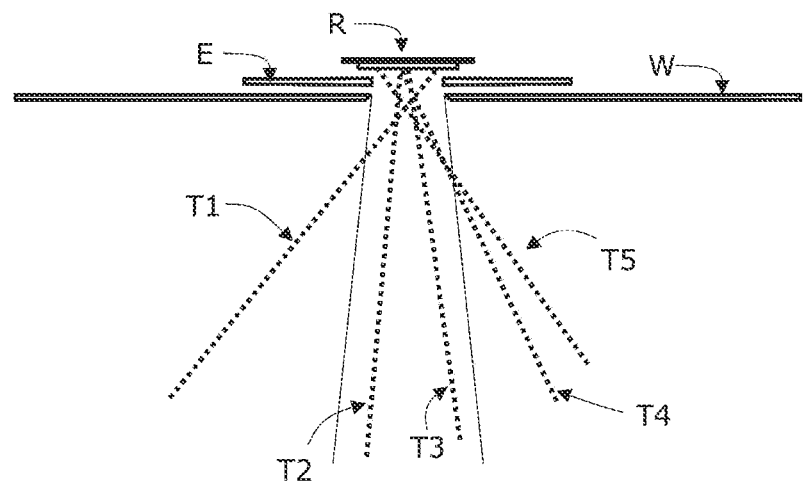
FIG. 1 depicts a prior art particle control apparatus and the trajectories of weakly charged particles landing on a reticle.

FIG. 1 shows a prior art particle control apparatus that employs physical barriers W and electrodes E in the immediate periphery of the reticle R to respectively block particles and remove particles from the surface of the reticle. The trajectories T1, T4 and T5 correspond to the trajectories of weakly charged particles that the particle control apparatus is not able to deflect or capture, meanwhile, the trajectories T2 and T3 are trajectories of particles traveling within the optical path that reaches the reticle. Given that the energy of EUV photons is larger than the ionization energy of any material, the particles with trajectories T2 and T3 can become positively charged while they travel within the optical path. Nevertheless, as the electrodes arranged around the reticle in FIG. 1 are located in the immediate periphery of the reticle, they are unable to stop or deflect particles T2 and T3 while simultaneously stopping or deflecting particles with a negative charge.

Figure 2:
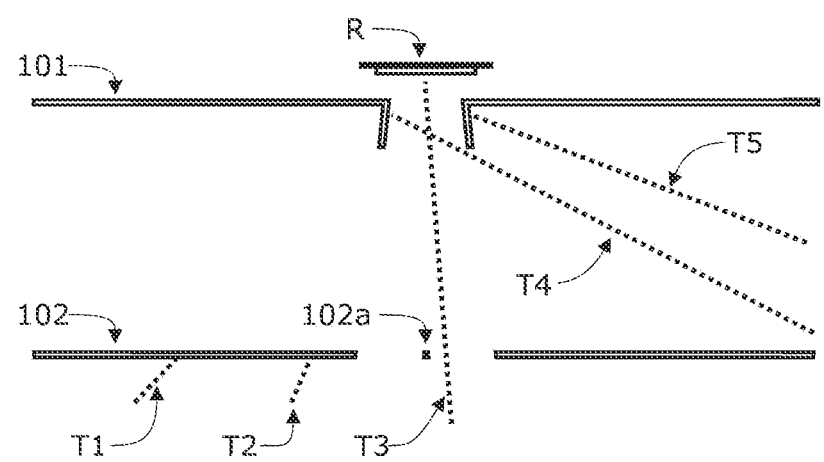
FIG. 2 shows an embodiment of the invention and the trajectories of weakly charged particles blocked by the protection electrodes.

FIG. 2 shows an embodiment of the invention employing two protection electrodes 101 and 102. The protection electrodes can be implemented as solid plates, meshes or parts of other components such the walls of a chamber, a reticle illumination apparatus, heat sinks, support structures, etc. The protection electrodes have at least one aperture with a shape that corresponds with that of a cross section, across each protection electrode, of an optical path that reaches the optical element or with a shape of a reticle-illumination aperture. In the embodiment of FIG. 2, the protection electrode 102 is arranged in the region in which the optical path diverges in two beams. Furthermore, according to an embodiment of the invention, the protection electrode 102 is divided in two regions, one corresponding to most of the electrode, and a region 102a located between the two beams that form the optical path. According to an embodiment of the invention, the protection electrode 101 is located nearby the reticle R and has a non-flat cross section. FIG. 2 also shows five trajectories of particles, only one of which is able to land on the surface of the reticle. Due to the geometrical constrains imposed by the protection electrodes, the particle with the trajectory T3 is very likely to be strongly charged due to the absorption of EUV photons, and likewise, said particle is very likely to have been emitted from the surface of the last mirror employed by the illumination optics. Experimental data has shown that most of the particles landing on EUV reticles are Si, Ru and Sn particles, as well as hydrocarbons. By geometrically limiting the trajectories of particles able to land on the reticle to particles being emitted from the surface of other EUV mirrors, the size, speed and composition of such particles can be limited to well characterized groupings. Likewise, as the EUV mirrors are already mounted on extremely stable platforms, the likelihood of high speed particles being emitted from their surfaces is decreased.

Figure 3:
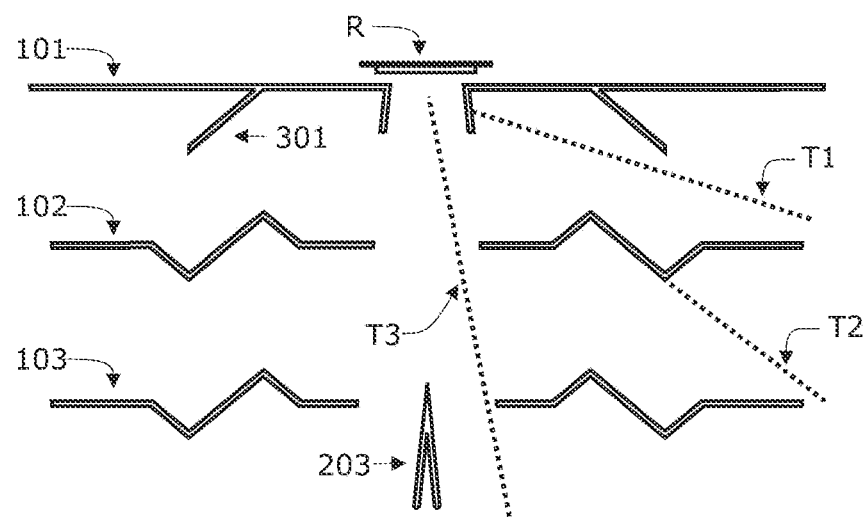
FIG. 3 shows another embodiment of the invention and the trajectories of weakly charged particles blocked by the protection electrodes.
Figure 4:
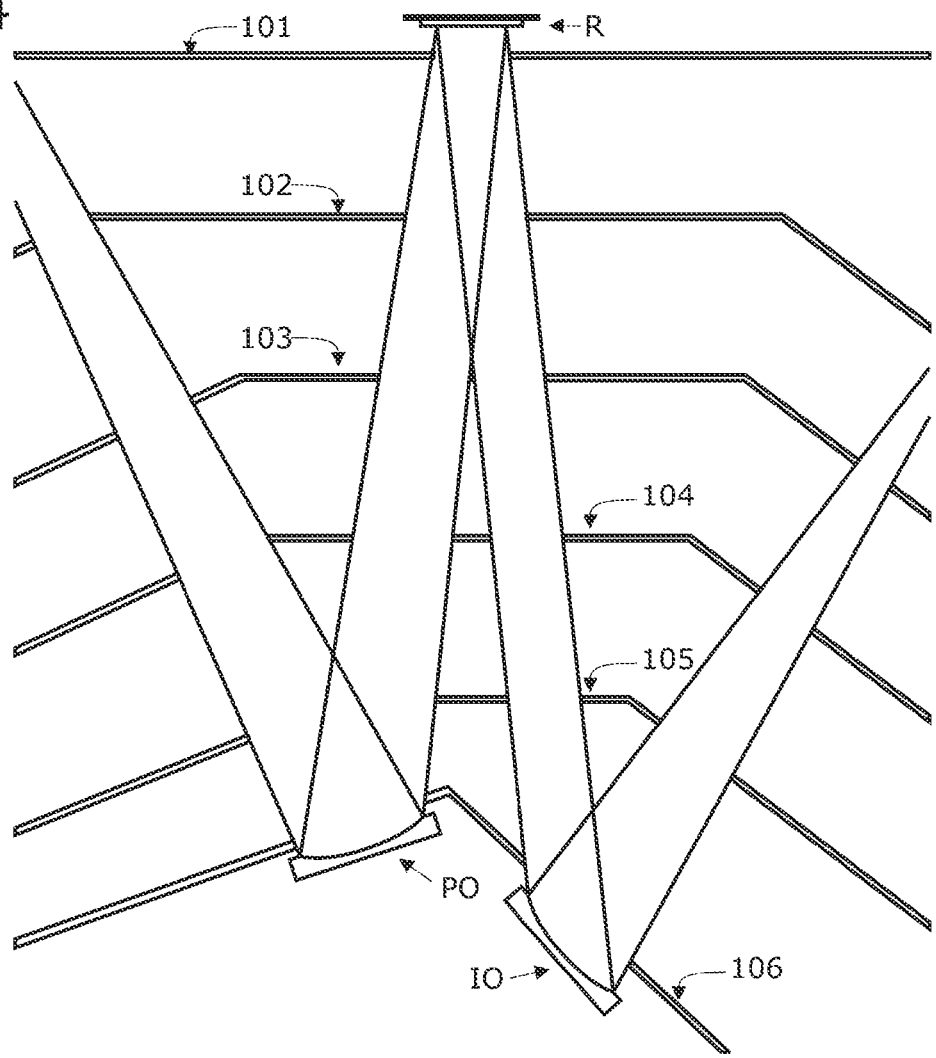
FIG. 4 shows another embodiment of the invention employing protection electrodes that are arranged across the optical path between the reticle and the projection and illumination optics.

FIG. 3 shows a combination of various embodiments of the invention. The protection device from FIG. 3 employs protection electrodes with more complex cross sections and includes the use of an additional electrode 301 attached to protection electrode 101 and of an electrode 203 that encloses part of the optical path. The trajectories illustrated in FIG. 3 show that only particles with trajectories located within the optical path are able to reach the reticle. FIG. 4 shows an embodiment of the invention employing six protection electrodes 101-106 that are arranged across the entire optical path between the reticle R and mirrors PO, IO which respectively belong to the projection and illumination optics. It is worth mentioning that the use of protection electrodes, and of the other electrodes employed by embodiments of the invention has some effect on the pressure that can be achieved inside the vacuum chambers forming the lithographic or inspection tool, and depending on the geometry and separation of the electrodes some regions may be subject to differential pumping (which may be desired or not depending on other features of the tool). The protection electrodes illustrated in the figures have substantially straight cross sections; however, it shall be noted that the electrodes employed by the invention can have any geometrical shape without deviating from the spirit of the invention.

Figure 5:
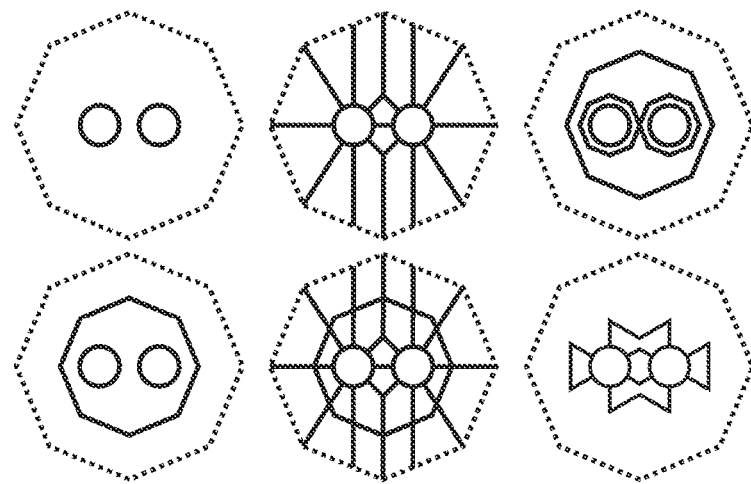
FIG. 5 shows protection electrodes, some of which are divided in multiple regions according to various embodiments of the invention.

FIG. 5 shows different geometries for the protection electrodes according to various embodiments of the invention. The protection electrodes may be formed by a single element having a single or multiple apertures for the optical path, or may be divided in multiple regions. The different regions of a protection electrode or other types of electrode used by the invention can be biased at different voltages, heated or cooled to form thermophoretic or cold traps, and/or to geometrically shape the electrodes to form complex shapes.

Figure 6:
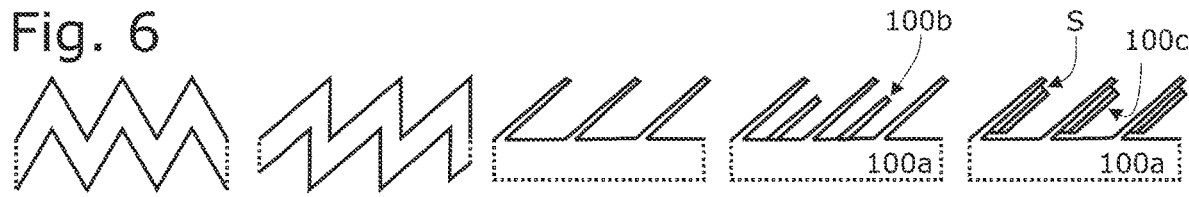
FIG. 6 shows the surface of electrodes according to various embodiments of the invention.
Figure 7:
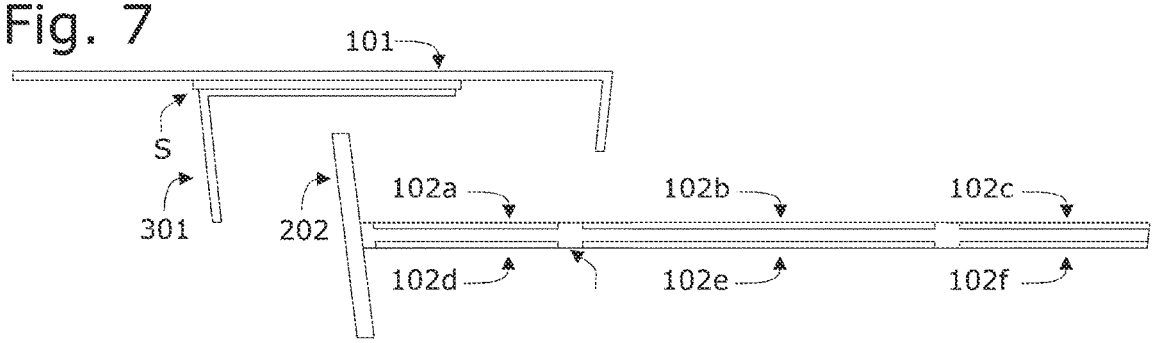
FIG. 7 shows the use of separators to separate the additional electrodes from the protection electrodes and to build a multilayer electrode arrangement according to various embodiments of the invention.
Figure 8:
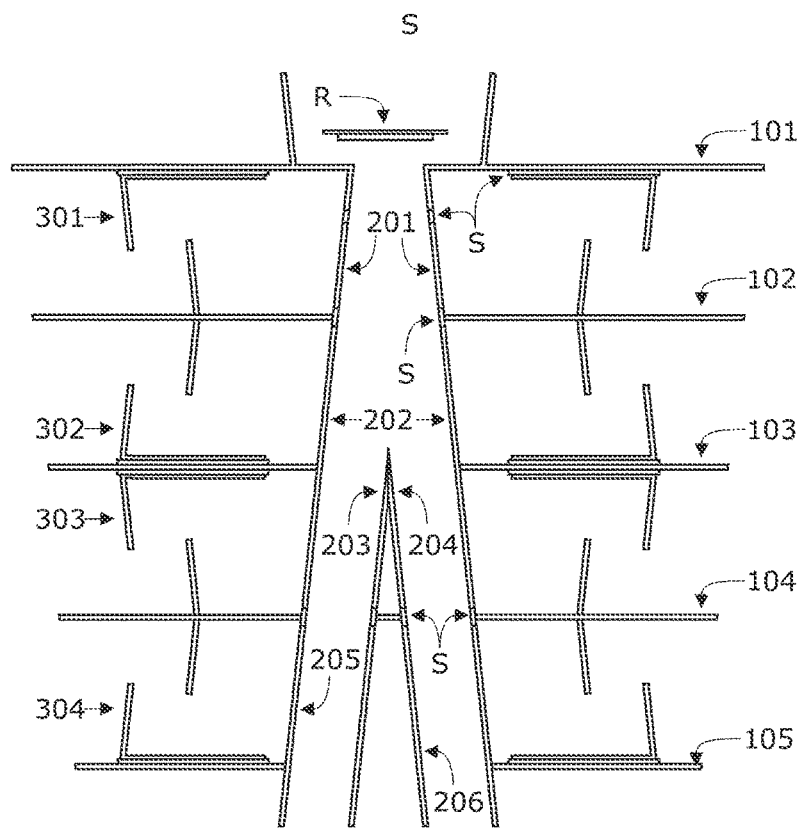
FIG. 8 shows another embodiment of the invention employing additional electrodes attached to the protection electrodes and electrodes that enclose the optical path.

FIG. 6 shows cross sections of the electrodes having different geometries according to various embodiments of the invention, the electrodes can be shaped to decrease the likelihood of a particle bouncing off their surface and returning to the space between electrodes. Fins 100b, which may be tilted or not, can be formed on the surface of the electrodes 100a and further electrodes 100c can be attached to such fins in order to divide the electrodes in multiple regions. FIG. 7 shows the use of separators S according to various embodiments of the invention. A single or multiple separators S can be used to attach an additional electrode 301 to the protection electrode 101, as well as to attach an electrode 202 that encloses the optical path to another electrode, and/or to form a multilayer electrode arrangement having a plurality of regions 102a-102f. The separators can form vibration dampers, electrical or thermal insulators and/or conduits for providing a cooling or heating fluid, electrical power, data cables or gases to the components of the protection module or to other components of the tool (such as electrodes, heaters, coolers, ionizers, magnets, valves, sensors etc). FIG. 8 shows a combination of embodiments of the invention that uses additional electrodes 301-304, that are attached to the protection electrodes 101-105 using separators S, in order to form circuitous paths within the protection module, as well as the use of electrodes 201-206 enclosing the optical path which are attached and separated from each other and from the protection electrodes using separators S.

According to different embodiments of the invention, the electrodes can be biased to deflect or attract charged particles as needed, forming electrostatic traps to catch the particles traveling within the protection module. The voltages applied to the electrodes can be defined by DC, AC or pulsating waveforms or a combination thereof. Likewise, a single electrode can be divided in a plurality of regions to which different DC, pulsating or AC (in or out of phase) waveforms or a combination thereof can be applied to shape the electric field within and around the protection module. The voltages applied to the electrodes can be tuned to better deflect the particles traveling within the optical path based on the expected physical features of such particles. According to an embodiment of the invention, it may be desired to maintain the voltage of the electrodes located closest to the reticle at the same potential as the surface of the reticle. In a different embodiment at least some regions of the electrodes located closest to the reticle are maintained at a potential higher or lower than that of the surface of the reticle R in order to extract particles from its surface. Although some types of electrodes have been described in plural, the invention can be implemented using at least one of said electrodes as pursued in the claims.

In a different embodiment of the invention at least part of the surface of the electrodes is chemically or physically treated to modify its effective surface area, surface energy or reactivity. The surface treatment can be used to modify the sputtering yield, sputter threshold energy or ion implantation yield of the electrodes in order to reduce the emission of particles. The surface treatment can also be used to modify the reflectivity or conductivity of the electrodes or to provide catalysts to help breaking the captured particles into volatile species that can be pumped outside the vacuum chambers more easily.

Figure 9:
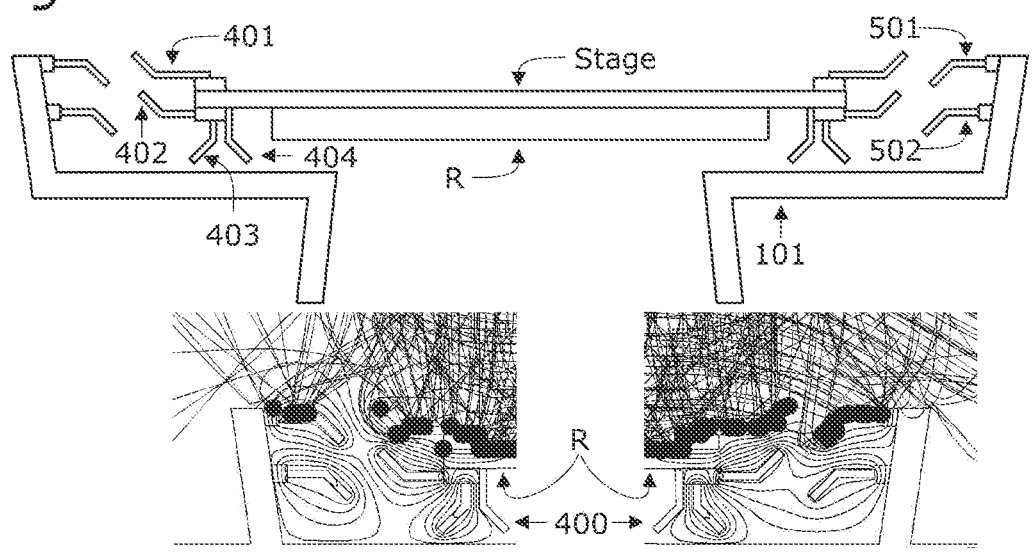
FIG. 9 shows another embodiment of the invention employing stage protection electrodes attached to a stage that carries the optical element and complementary protection electrodes arranged on the periphery of the stage.

FIG. 9 shows a combination of embodiments of the invention that employs stage protection electrodes 400-404 attached to the stage that carries the reticle R and complementary protection electrodes 501-502 that are arranged in the periphery of the stage. The stage protection electrodes and complementary protection electrodes can be biased to deflect or attract particles origination from behind the reticle. FIG. 9 also shows the trajectories of particles emitted from behind the reticle being captured or deflected, as well as electric field lines formed by said electrodes.

Figure 10:
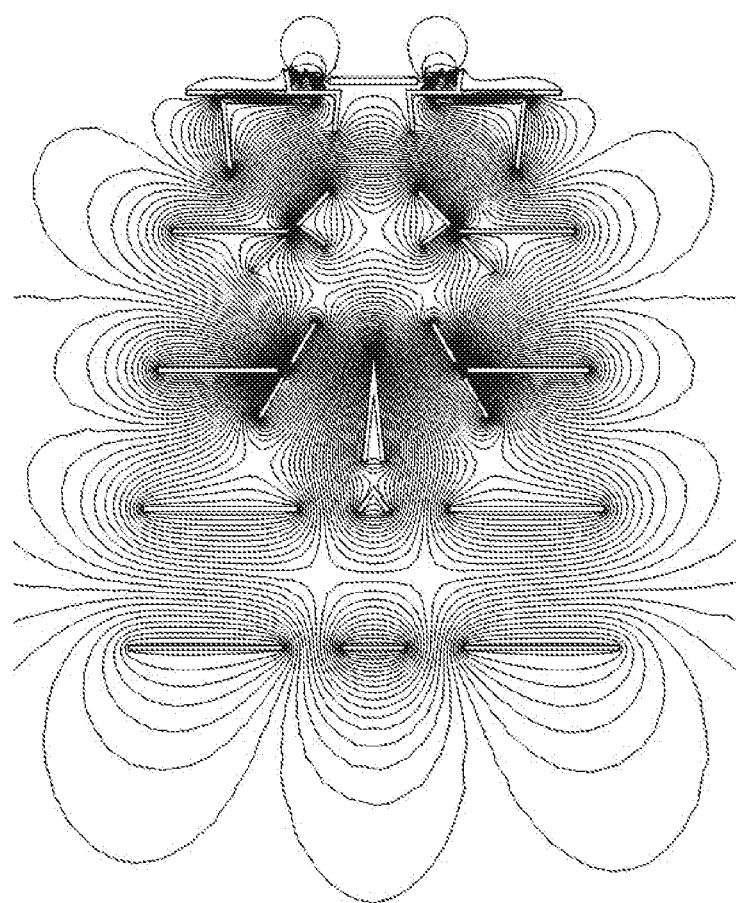
FIG. 10 shows another embodiment of the invention employing additional electrodes attached to the protection electrodes, electrodes that enclose the optical path arranged such that particles bouncing off their surface are not directed towards the aperture of the first protection electrode and field lines showing electrostatic traps.
Figure 11:
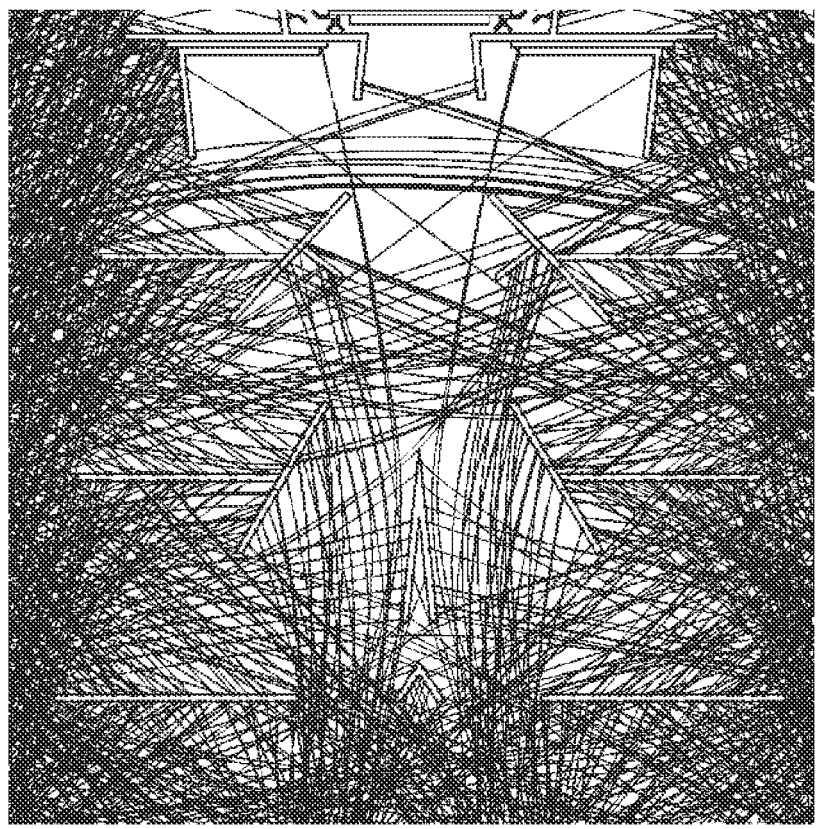
FIG. 11 shows the trajectories of weakly charged high speed particles being deflected away from the reticle according to an embodiment of the invention.
Figure 12:
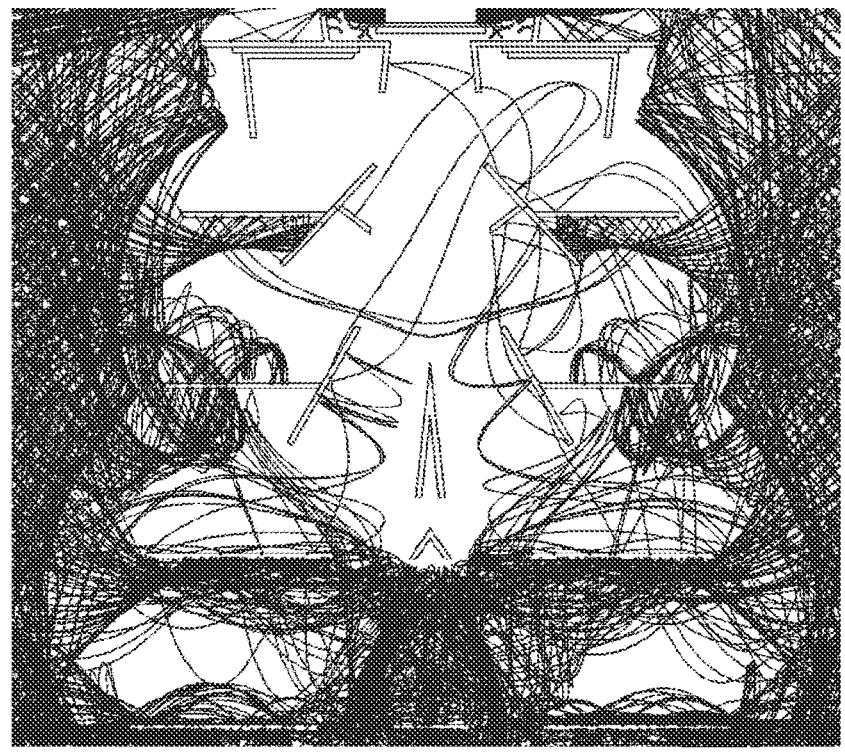
FIG. 12 shows the trajectories of particles that are deflected or captured according to an embodiment of the invention.

FIG. 10 shows another embodiment of the invention employing additional electrodes attached to the protection electrodes, electrodes that enclose the optical path which are arranged such that particles bouncing off their surface are not directed towards the aperture of the first protection electrode and field lines showing electrostatic traps. The optical path has regions that have both uniform and not uniform electric fields, being this useful for deflecting polar particles. FIG. 11 shows the trajectories of thousands of weakly charged tin particles with diameters of less than 100 nm and initial speed of 100 m/s being deflected away from the reticle according to the protection module shown in FIG. 10. FIG. 12 shows the trajectories of particles having a variety of speeds, diameters and charges being deflected away from the reticle. As the particles become positively charged as they travel towards the reticle, it is possible to shape the electric field to strongly reject positive particles without resulting in the acceleration of negative particles towards the reticle. The electrostatic traps formed inside the optical path and between the protection electrodes capture even weakly charged particles that bounce multiple times from the surface of the electrodes. FIG. 12 also shows the extraction of particles from the periphery of the reticle, said particles are directed to electrodes located away from the reticle, reducing in this way the likelihood of said particles being able to reach the surface of the reticle.

Figure 13:
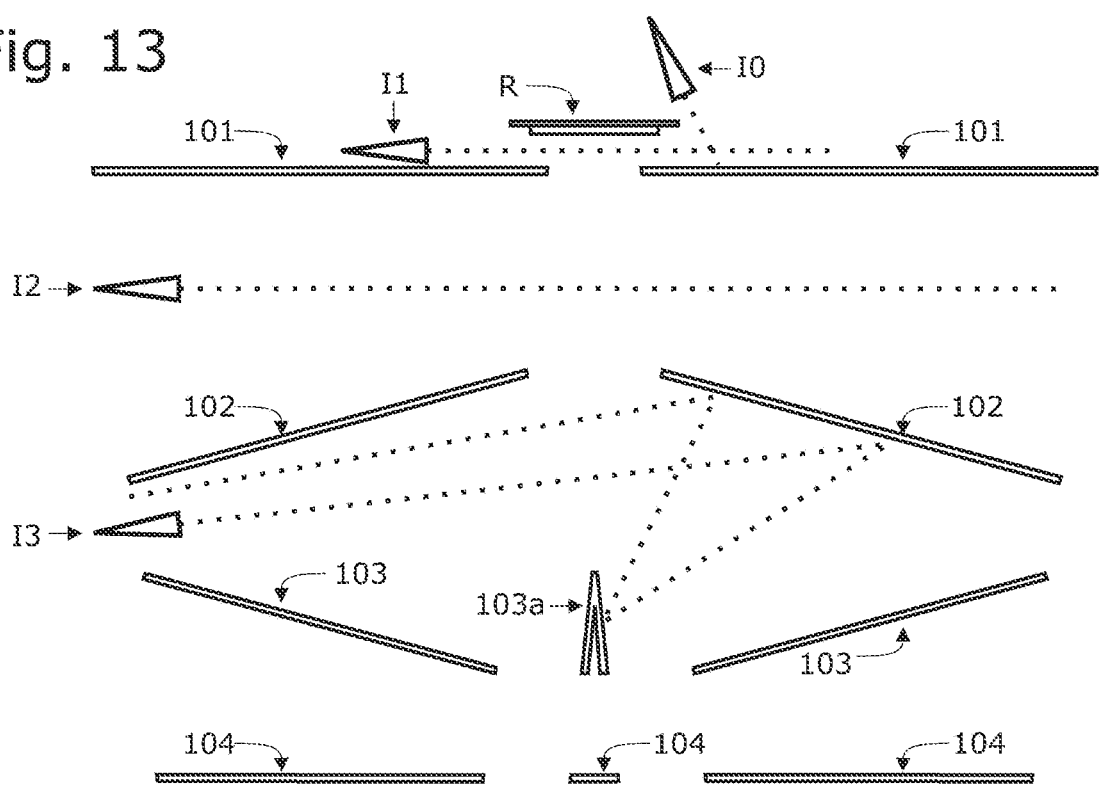
FIG. 13 shows another embodiment of the invention employing ionizers.

Despite the fact that the particles able to reach the reticle have trajectories located within the optical path and are strongly ionized by EUV photons, it may be useful to provide at least one ionization device in order to further ionize the particles. Such ionization devices can be implemented as electron, ion (electron or ion guns) or photon sources (i.e. UV lamps). FIG. 13 shows an embodiment of the invention employing ionizers 10-13. The ionizers are arranged such that they ionize particles traveling within the optical path but do not interfere with the actinic light reaching the reticle. The ionizers can be arranged between the protection electrodes and in front or around the reticle. FIG. 13 shows an embodiment of the invention in which some of the electrodes are arranged to reflect multiple times the photons emitted by ionizer 13 such that the likelihood of a particle being ionized increases. In a different embodiment of the invention ionizers can be used to help cleaning the electrodes by breaking the captured particles into volatile species, or if they are operated with enough intensity, to deflect particles traveling within the optical path.

Figure 14:
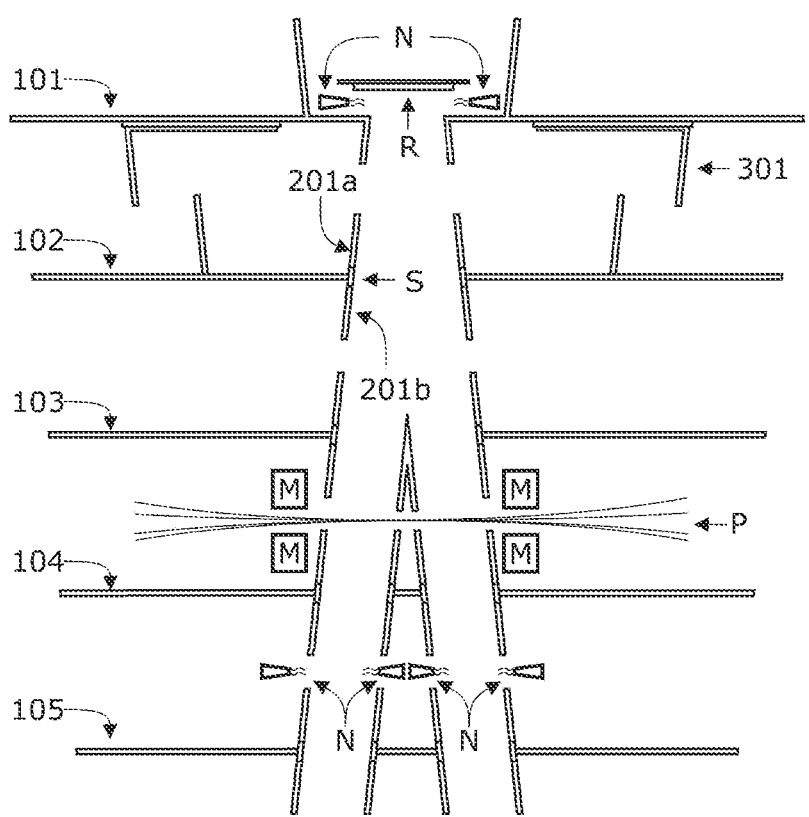
FIG. 14 shows another embodiment of the invention employing gas curtains, a plasma curtain, additional electrodes attached to the protection electrodes and electrodes that enclose the optical path.

FIG. 14 shows a combination of embodiments of the invention that employs nozzles N to provide gases to regions of the protection module, such regions can be located at least partially within the optical path. The nozzles N can be arranged to form a gas curtain that deflects particles away from the optical path or to form part of a thermophoretic trap. The gas can be provided continuously or provided in an intermittent manner. FIG. 14 also shows the use electrodes that enclose the optical path having gaps between them and the use of a plasma curtain P comprising a plasma that is compressed and directed at least partially inside the optical path, the plasma can be compressed using an electromagnetic field provided by the electrodes and/or magnets M. The plasma curtain captures particles traveling within the optical path and ionizes the particles it could not trap. However, as the plasma curtain can emit actinic light depending on the photoresists and gases being used, it can blur the printed features.

Given that the light emitted by a plasma can blur the printed features, a different embodiment of the invention employs a plasma detection circuit that detects the ignition of a plasma between at least two electrodes of the protection module. The plasma can be detected as a short between electrodes, a sudden increase in temperature or as light detected by a sensor. When plasma is detected the protection module sends a message to an external controller to indicate the ignition of a plasma. Said message can be useful to maintain the critical dimension uniformity of the printed features. In a different embodiment of the invention the protection module can take actions to extinguish or modify the plasma, such action can comprise stopping or increasing the flow of gas to the region in which the plasma was detected, introducing a different gas that changes the composition of gases in the region in which plasma was detected, shorting or modifying the voltage of the electrodes that may have ignited the plasma, and/or by applying electromagnetic pulses to the region in which the plasma was detected.

Although several embodiments of the present invention have been depicted and described in detail, it will be apparent to those skilled in the art that various modifications, additions, substitutions, and the like can be made to such embodiments without departing from the spirit of the invention, and likewise, that the invention can be implemented as any combination of the embodiments that have been described, resulting in that all these are considered to be within the scope of the invention as defined in the following claims.

What is claimed is:

1. Protection module for maintaining a surface of an optical element free of foreign particles, comprising:
   a first protection electrode arranged at a first distance from the surface of the optical element and having at least one aperture with a shape that corresponds with that of a cross section, across the first protection electrode, of an optical path that reaches the optical element or with a shape of a reticle-illumination aperture;
   a second protection electrode arranged at a second distance from the surface of the optical element that is larger than the first distance and having at least one aperture with a shape that corresponds with that of a cross section, across the second protection electrode, of the optical path;
   at least one particle trap that captures particles traveling within the optical path;
   wherein the protection electrodes are shaped and arranged so that the only particles able to reach the surface of the optical element are particles having trajectories located almost entirely within the optical path;
   and wherein the optical path is defined as the path that actinic light takes between the optical element and mirrors located immediately before and after the optical element.

2. Protection module according to claim 1, further comprising at least one additional protection electrode arranged at a distance from the surface of the optical element that is larger than the first distance, said at least one additional protection electrode has at least one aperture with a shape that corresponds with that of a cross section, across the at least one additional protection electrode, of the optical path.

3. Protection module according to claim 2, further comprising arranging protection electrodes across substantially all the optical path between the optical element and at least one different optical element.

4. Protection module according to claim 1, wherein the at least one particle trap is an electrostatic trap contained at least partially inside the optical path.

5. Protection module according to claim 1, further comprising at least one additional electrode that is attached to the protection electrodes in order to form a circuitous path and/or to shape at least one electrostatic trap.

6. Protection module according to claim 1, further comprising at least one electrode that encloses part of the optical path.

7. Protection module according to claim 1, further comprising at least one electrode that encloses part of the optical path and that is arranged such that particles bouncing off its surface are not directed towards the aperture of the first protection electrode.

8. Protection module according to claim 1, wherein at least one electrode is divided in a plurality of regions that are insulated from neighboring regions; and wherein the plurality of regions are biased at different voltages in order to deflect or attract particles or wherein the temperature of at least one of the plurality of region is controlled using at least one heater or cooler.

9. Protection module according to claim 1, wherein at least one electrode consist, at least partially, of a multilayer electrode arrangement comprising at least two electrically conductive layers and at least one separator; wherein the at least one separator comprises a vibration damper, an electrical or thermal insulator or a conduit for providing a cooling or heating fluid, electrical power, data cables or gases to other components.

10. Protection module according to claim 1, wherein the at least one particle trap is a gas curtain contained at least partially inside the optical path, and the protection module comprises at least one nozzle arranged to introduce, at least temporarily, a gas in a region located at least partially within the optical path.

11. Protection module according to claim 1, further comprising at least one stage protection electrode that is attached to a stage that carries the optical element; and at least one complementary protection electrode that is arranged on the periphery of the stage; wherein at least one of said at least one stage protection electrode and said at least one complementary protection electrode is biased to deflect or attract particles.

12. Protection module according to claim 1, further comprising at least one ion, electron or photon source that ionizes particles within the optical path or around the optical element.

13. Protection module according to claim 1, wherein at least part of the surface of the electrodes is chemically or physically treated to modify its effective surface area, surface energy, reactivity, sputtering yield or sputter threshold energy.

14. Protection module according to claim 1, wherein the at least one particle trap is a plasma curtain comprising a plasma that is compressed and directed at least partially inside the optical path by using an electromagnetic field.

15. Protection module according to claim 1, further comprising a plasma detection circuit that detects the ignition of a plasma between at least two electrodes of the protection module, and wherein the protection module sends a message to an external controller to indicate the ignition of the plasma.

16. Protection module according to claim 15, wherein upon the detection of the plasma the module extinguishes or modifies the plasma by stopping or increasing the flow of gas to the region in which the plasma was detected, by introducing a different gas that changes the composition of the gas in the region in which plasma was detected, by shorting or modifying the voltage of electrodes, or by applying electromagnetic pulses to the region in which the plasma was detected.

17. Method for maintaining a surface of a reflective optical element free of foreign particles, comprising:
   arranging a first protection electrode at a first distance from the surface of the optical element, the first protection electrode has at least one aperture with a shape that corresponds with that of a cross section, across the first protection electrode, of an optical path that reaches the optical element or with a shape of a reticle-illumination aperture;

arranging a second protection electrode at a second distance from the surface of the optical element that is larger than the first distance, the second protection electrode has at least one aperture with a shape that corresponds with that of a cross section, across the second protection electrode, of the optical path;

capturing particles traveling within the optical path using at least one particle trap arranged nearby the optical path;

wherein the protection electrodes are arranged so that the only particles able to reach the surface of the optical element are particles having trajectories located almost entirely within the optical path;

and wherein the optical path is defined as the path that actinic light takes between the optical element and mirrors located immediately before and after the optical element.

* * * * *